US012793782B2

(12) United States Patent
Miranda et al.

(10) Patent No.: US 12,793,782 B2
(45) Date of Patent: Nov. 10, 2026

(54) MULTI-LEVEL CELL AND MULTI-SUB-BLOCK PROGRAMMING IN A MEMORY DEVICE

(71) Applicant: MICRON TECHNOLOGY, INC., Boise, ID (US)

(72) Inventors: Lawrence Celso Miranda, San Jose, CA (US); Sheyang Ning, San Jose, CA (US); Jeffrey S. McNeil, Nampa, ID (US); Tomoko Ogura Iwasaki, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 558 days.

(21) Appl. No.: 18/081,114

(22) Filed: Dec. 14, 2022

(65) Prior Publication Data

US 2023/0207019 A1 Jun. 29, 2023

Related U.S. Application Data

(60) Provisional application No. 63/293,518, filed on Dec. 23, 2021.

(51) Int. Cl.
*G11C 16/10* (2006.01)
*G11C 16/08* (2006.01)
*G11C 16/24* (2006.01)

(52) U.S. Cl.
CPC ............ *G11C 16/102* (2013.01); *G11C 16/08* (2013.01); *G11C 16/24* (2013.01)

(58) Field of Classification Search
CPC ... G11C 16/102; G11C 16/24; G11C 16/3422; G11C 16/10; G11C 11/5628; G11C 16/34; G11C 16/0483; G11C 16/08
See application file for complete search history.

(56) References Cited

U.S. PATENT DOCUMENTS

2008/0117683 A1* 5/2008 Hemink .............. G11C 11/5621 365/185.18
2011/0007569 A1* 1/2011 Lutze ..................... G11C 16/10 365/185.17
2011/0013458 A1* 1/2011 Seol ....................... H10B 41/20 365/189.04
2012/0081963 A1* 4/2012 Dutta ..................... G11C 16/10 365/185.17
2019/0378580 A1* 12/2019 Zhao ........................ G11C 7/02

* cited by examiner

*Primary Examiner* — Uyen Smet
(74) *Attorney, Agent, or Firm* — Lowenstein Sandler LLP

(57) ABSTRACT

Control logic in a memory device causes a boost voltage to be applied one or more times to a plurality of unselected wordlines of a block of the memory array, the block comprising a plurality of sub-blocks, and the boost voltage to boost a channel potential of each of the plurality of sub-blocks by an amount each time the boost voltage is applied. The control logic further selectively discharges the amount of boost voltage from one or more of the plurality of sub-blocks after each time the boost voltage is applied according to a data pattern representing a sequence of bits to be programmed to respective memory cells of the plurality of sub-blocks. Additionally, the control logic causes a single programming pulse to be applied to one or more selected wordlines of the block to program the respective memory cells of the plurality of sub-blocks according to the data pattern.

14 Claims, 7 Drawing Sheets

MULTI-LEVEL CELL AND MULTI-SUB-BLOCK PROGRAMMING IN A MEMORY DEVICE

RELATED APPLICATION

This application claims the benefit of U.S. Provisional Application 63/293,518 filed on Dec. 23, 2021, the entire content of which is incorporated by reference herein.

TECHNICAL FIELD

Embodiments of the disclosure relate generally to memory sub-systems, and more specifically, relate to multi-level cell and multi-sub-block programming in a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
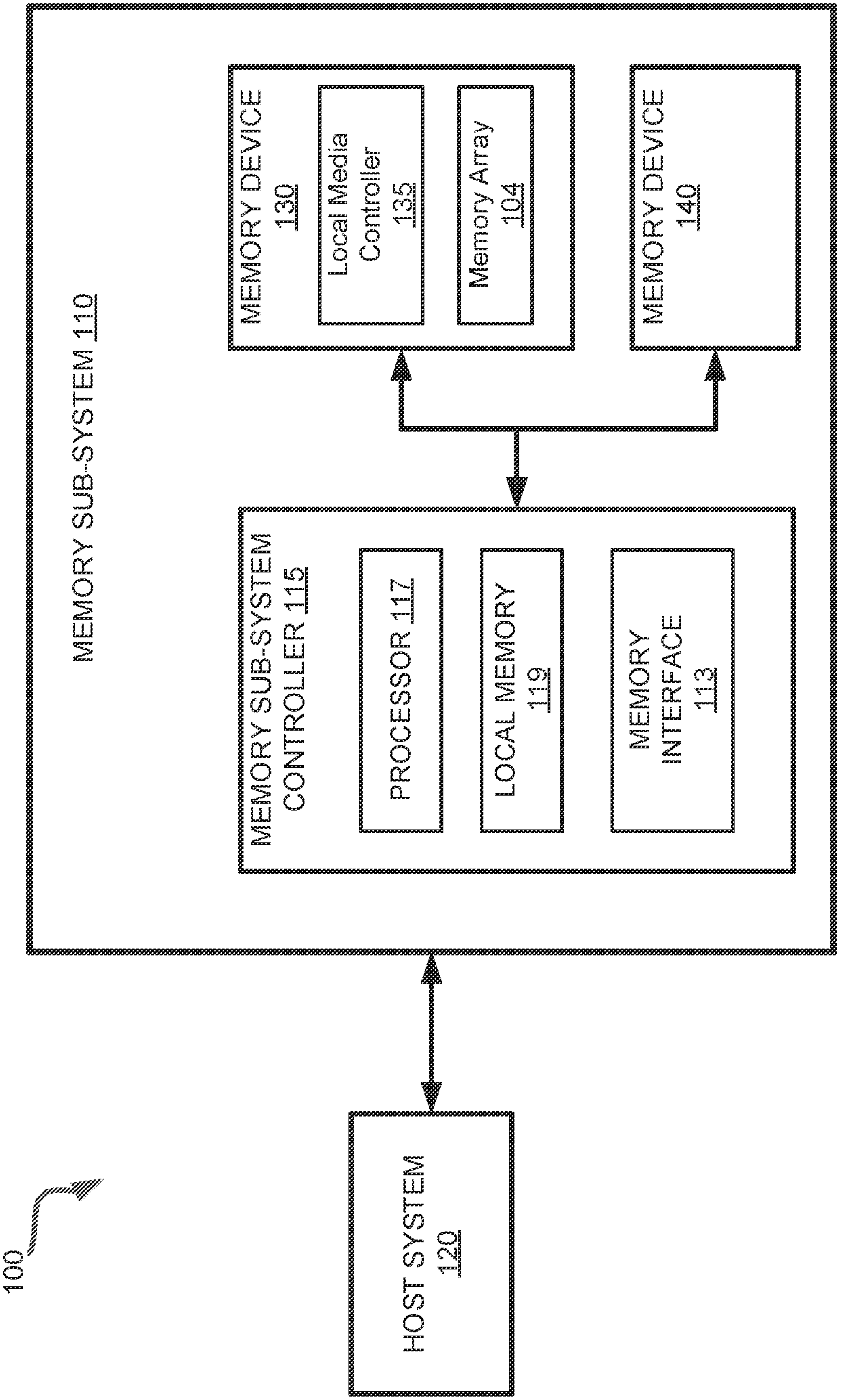
FIG. 1A illustrates an example computing system that includes a memory sub-system in accordance with some embodiments of the present disclosure.

Aspects of the present disclosure are directed to a multi-level and multi-sub-block programming in a memory device of a memory sub-system. A memory sub-system can be a storage device, a memory module, or a combination of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bit lines) and rows (also hereinafter referred to as word lines). A word line can refer to one or more rows of memory cells of a memory device that are used with one or more bit lines to generate the address of each of the memory cells. The intersection of a bit line and word line constitutes the address of the memory cell. A block hereinafter refers to a unit of the memory device used to store data and can include a group of memory cells, a word line group, a word line, or individual memory cells. One or more blocks can be grouped together to form separate partitions (e.g., planes) of the memory device in order to allow concurrent operations to take place on each plane. Each data block can include a number of sub-blocks, where each sub-block is defined by an associated pillar (e.g., a vertical conductive trace) extending from a shared bit line. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of channel material. The memory cells can be coupled to access lines, which are commonly referred to as "word lines," often fabricated in common with the memory cells, so as to form an array of strings in a block of memory. The compact nature of certain non-volatile memory devices, such as 3D flash NAND memory, means word lines are common to many memory cells within a block of memory.

During a program operation on a non-volatile memory device, certain phases can be encountered, including program, program recovery, program verify, and program verify recovery. During a programming operation, a selected memory cell(s) can be programmed with the application of a programming voltage to a selected word line. Certain program operations can be single program operations, where one sub-block is programmed in each operation. In such a single program operation, a data pattern for one sub-block is read from a temporary storage location (e.g., a page buffer) to determine whether the memory cell associated with a selected wordline and located in the one sub-block is to be programmed or not, and a single programming pulse can be applied before the program verify phase occurs. This same process can then be repeated for each remaining sub-block to be programmed. In some memory devices, memory cells can store two or more bits—e.g., memory cells can be multi-level memory cells. In such memory devices, certain program operations can program each level individually for each sub-block—e.g., program each possible logical state of the memory cell independently. Other program operations can program all levels for a sub-block concurrently. In either case, programming multiple levels involves causing multiple pulses to be applied to ramp up different pillars according to the data pattern. There are latencies associated with each pulse applied. These latencies can increase the length of the program operation, especially when the process is repeated for each sub-block.

Aspects of the present disclosure address the above and other deficiencies by implementing multi-level multi-sub-block programming in a memory device of a memory sub-system. In a multi-level multi-sub-block program operation, control logic in memory device can program multiple levels concurrently and program multiple sub-blocks concurrently using a single programming pulse applied to a selected wordline. In an embodiment, as part of a programming operation, the control logic can load data for multiple sub-blocks and store it in the page buffers. The control logic can then cause a boost voltage to be applied for a first time to unselected wordlines (e.g., the wordlines not associated with the memory cell(s) to be programmed) in a block of memory cells. The boost voltage boosts a memory pillar channel voltage in each sub-block of the memory device by an amount (e.g., a boost amount or a higher boost voltage than before it is applied) during this phase of the program operation—e.g., for each sub-block selected for the program operation. Once each pillar channel voltage is boosted by the amount after applying the boost voltage the first time the control logic can selectively discharge the memory pillar of one or more sub-blocks according to a data pattern of bits to be programmed to the block during the program operation. For example, if a memory cell is located in a first sub-block to be programmed to a first logic state (e.g., a first level), the control logic can activate a select gate device at a drain of the first sub-block to allow the amount of voltage at the first sub-blocks to be discharged onto the bitline, thereby bringing the pillar channel voltage back to a ground voltage. After selectively discharging the one more sub-blocks, the control logic can apply the boost voltage for a second time to the unselected wordlines to boost the memory pillar channel voltage in each sub-block by the amount. Once each pillar channel voltage is boosted by the amount after applying the boost voltage the second time, the control logic can selectively discharge the memory pillar of one or more sub-blocks according to a data pattern of bits to be programmed to the block during the program operation.

The control logic can repeat this process (e.g., applying the boost voltage and selectively discharging one or more sub-blocks) until each pillar channel voltage is charged according to a data pattern of bits to be programmed to the block during the program operation. For example, the first sub-block can be discharged after the boost voltage is applied the first time but not after the boost voltage is applied the second or more times, while a second sub-block can be discharged after the boost voltage is applied the second or more times. Accordingly, different memory pillars can have different channel potentials after the boost voltage is done being applied. After the boost voltage is done being applied, the control logic can apply a single programming pulse to selected wordlines of the sub-blocks to be programmed. In some examples, a sub-block can be programmed to a logic state based on a difference between the pillar channel potential and the programming pulse. Accordingly, the single programing pulse can program different sub-blocks to different logical states.

In some embodiments, the number of times the boost voltage is applied can depend on a number of bits stored by the memory cell. For example, if the memory cells store two or more bits, the control logic can apply the boost voltage three times, if the memory cells store three or more bits, the control logic can apply the boost voltage seven times, and so on. The control logic can selectively discharge pillars after each time the boost voltage is applied.

Advantages of this approach include, but are not limited to, improved performance in the memory device. The programming operation described herein allows for programming multiple levels and multiple sub-blocks of multi-level cells to be programmed concurrently (e.g., simultaneously) via the single programming pulse. This results in fewer program operations being performed for the same amount of data being programmed to the memory device. Accordingly, the latency associated with the entire programming operation is reduced.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, “coupled to” or “coupled with” generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative- and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative- or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, memory device 130 includes a memory interface component 113. In at least one embodiment, memory interface component 113 can handle interaction of memory sub-system controller 115 with the memory devices of the memory sub-system 110, such as memory device 130. For example, memory interface component 113 can send memory access commands corresponding to requests received from host system 120 to memory device 130, such as program commands, read commands, and other commands. In some embodiments, the memory interface component 113 can receive data from memory device 130, such as data retrieved in response to a read command or a confirmation that a program command was successfully executed. In some embodiments.

In some embodiments, the memory sub-system controller 115 includes at least a portion of memory interface 113. For example, the memory sub-system controller 115 can include a processor 117 (e.g., a processing device) configured to execute instructions stored in local memory 119 for performing the operations described herein. In some embodiments, memory interface 113 is part of the host system 110, an application, or an operating system. In other embodiment, local media controller 135 includes at least a portion of memory interface 113 and is configured to perform the functionality described herein. In such an embodiment memory interface 113 can be implemented using hardware or as firmware, stored on memory device 130, executed by the control logic (e.g., memory interface 113) to perform the operations related to program operation described herein.

In one embodiment, memory device 130 includes local media controller 135 and a memory array 104. As described herein, local media controller 135 can perform a program operation on the memory cells of memory array 104. During the program operation, a program voltage (e.g., program pulse) is applied to a selected wordline(s) of the memory array 104, in order to program a certain level(s) of charge to selected memory cells on the wordlines(s) representative of a desired value(s)—e.g., to program a desired logic state to the selected memory cells. In one embodiment, by conditioning the channel potential associated with multiple sub-blocks of the memory array 104 according to a data pattern to be programmed to the memory cells contained therein, multiple memory cells storing two or more bits in separate sub-blocks can be accurately programmed using a single programming pulse—e.g., a multi-level and multi-block programming. For example, at the start of the program operation, local media controller 135 can cause a boost voltage to be applied to a plurality of unselected wordlines of a block of memory array 104 in memory device 130. The block can include a plurality of sub-blocks, and the boost voltage can boost a channel potential of each sub-block of the plurality of sub-blocks by an amount—e.g., by a boost amount.

Local media controller 135 can then selectively discharge the boost amount from one or more of the plurality of sub-blocks according to a data pattern representing a sequence of bits to be programmed to respective memory cells of those sub-blocks. The local media controller 135 can then apply the boost voltage a second time to the plurality of unselected wordlines. The boost voltage can again boost the channel potential of each sub-block of the plurality of sub-blocks by the boost amount. For example, the one or more of the plurality of sub-blocks that are selectively discharged can have one (e.g., a single, or one time) boost amount after the second time the boost voltage is applied while the remaining plurality of sub-blocks can have two (e.g., double or two times) boost amount. The local media controller 135 can then selectively discharge the boost amount from a second set of one or more of the plurality of sub-blocks according to a data pattern representing a sequence of bits to be programmed to respective memory cells of those sub-blocks.

The local media controller 135 can continue to apply the boost voltage and selectively discharge certain sub-blocks after each boost voltage is applied based on a number of levels or bits stored by each memory cell. For example, the local media controller 135 can apply the boost voltage three times (3) if each memory cell stores two (2) bits, seven times (7) if each memory cell stores three (3) bits, 15 times if each memory cell stores four (4) bits, etc. —e.g., the number of times the boost voltage is applied can be a number of levels minus one (1). Accordingly, after applying the boost voltage a number of times, each sub-block can have a channel potential according to the data pattern to be programmed. For example, if the local media controller 135 applies the boost voltage three (3) times, some sub-blocks can be at a ground voltage (e.g., no boost at all), some sub-blocks can be at a first amount (e.g., one boost amount), some sub-blocks can be at a second amount (e.g., two boost amount), and some sub-blocks can be at a third amount (e.g., three boost amount) according to the data pattern to be programmed. In such examples, the local media controller 135 can cause a single programming pulse to be applied to selected wordlines of the plurality of wordlines of the block to program the respective memory cells of the plurality of sub-blocks according to the data pattern—e.g., program multiple-levels across multiple sub-blocks concurrently. That is, a memory cell can be programmed to a logic state based on a difference between the programming pulse strength and the channel potential of the sub-block. For example, if the local media controller 135 can cause a first logic state to be programmed to the memory cell when the channel potential is at ground, a second logic state when the channel potential is at the one (1) boost amount, a third logic state when the channel potential is at the two (2) boost amount, and so forth. In such examples, when each sub-block is at a respective channel potential, the local media controller 135 can cause a single programming pulse to be applied to program memory cells in different sub-blocks to the desired logic state concurrently. Further details with regards to the operations of local media controller 135 are described below with reference to FIG. 4.

Figure 1B:
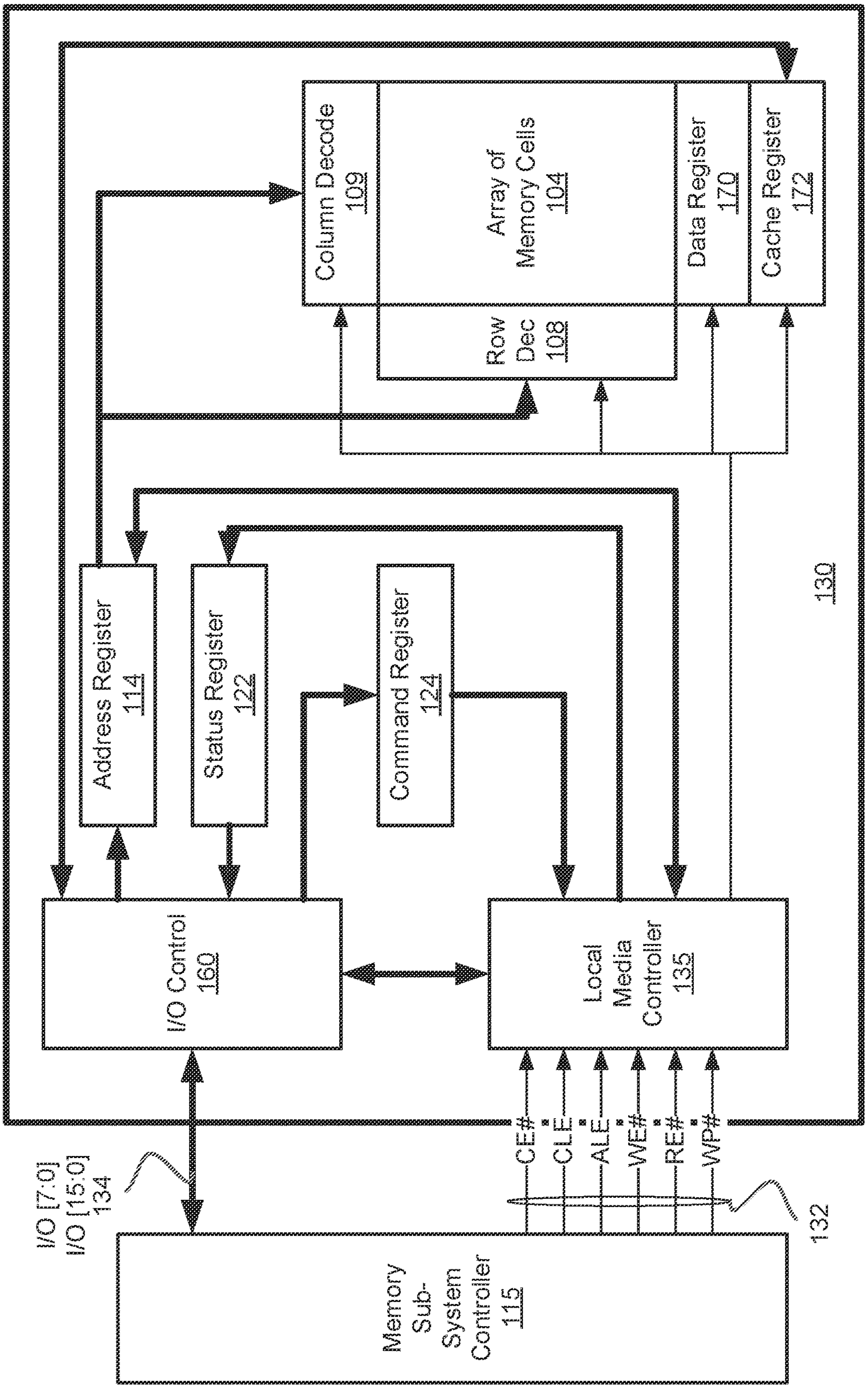
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states. In one embodiment, the array of memory cells 104 (i.e., a "memory array") can include a number of sacrificial memory cells used to detect the occurrence of read disturb in memory device 130, as described in detail herein.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 236 and outputs data to the memory sub-system controller 115 over I/O bus 236.

For example, the commands may be received over input/output (I/O) pins [7:0] of I/O bus 236 at I/O control circuitry 160 and may then be written into command register 124. The addresses may be received over input/output (I/O) pins [7:0] of I/O bus 236 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
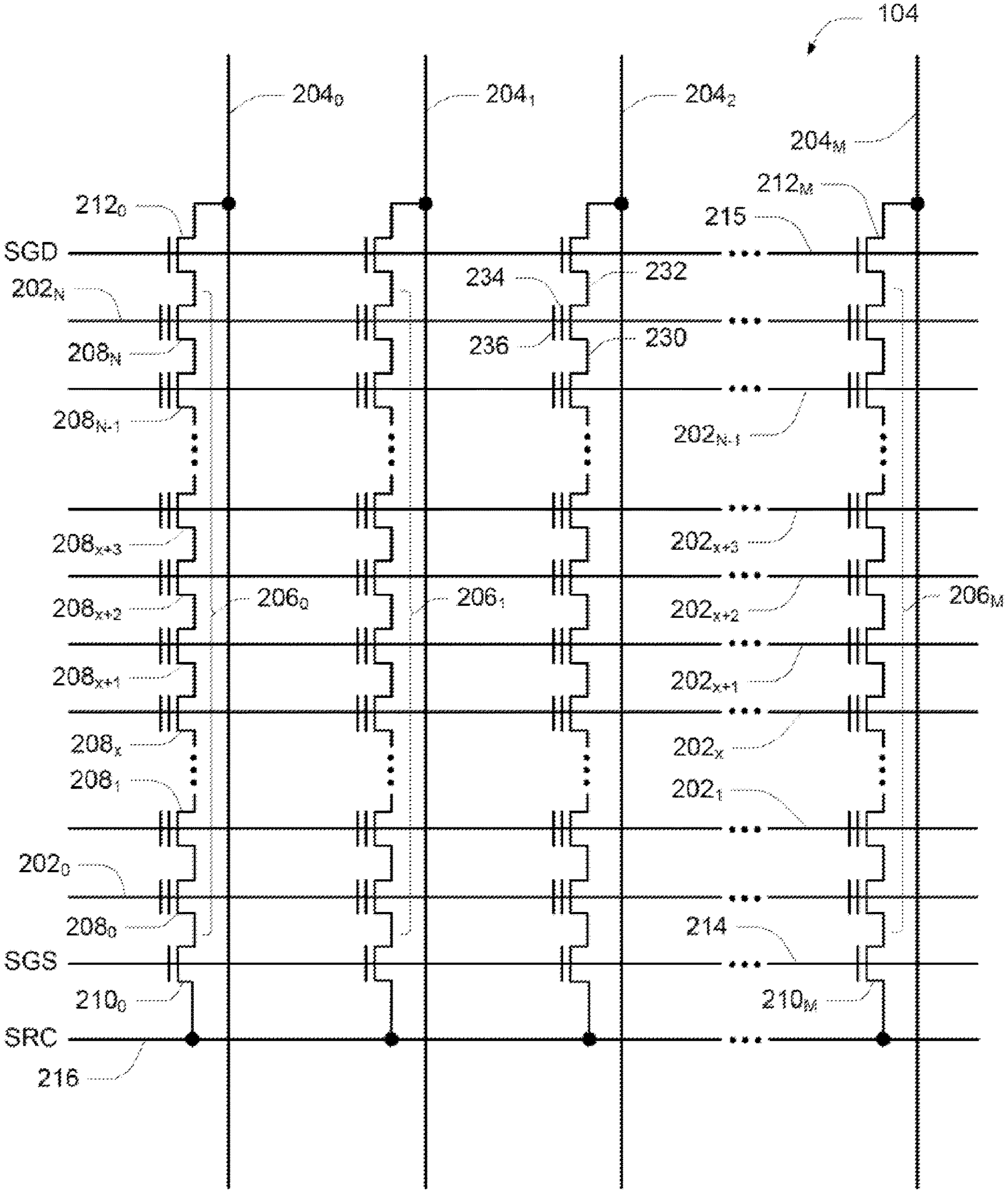
FIG. 2 is a schematic of portions of an array of memory cells as could be used in a memory of the type described with reference to FIG. 1B in accordance with some embodiments of the present disclosure.

FIG. 2 is a schematic of portions of an array of memory cells 104, such as a NAND memory array, as could be used in a memory of the type described with reference to FIG. 1B according to an embodiment. Memory array 104 includes access lines, such as wordlines $202_0$ to $202_N$, and data lines, such as bit lines $204_0$ to $204_M$. The wordlines 202 can be connected to global access lines (e.g., global wordlines), not shown in FIG. 2, in a many-to-one relationship. For some embodiments, memory array 104 can be formed over a semiconductor that, for example, can be conductively doped to have a conductivity type, such as a p-type conductivity, e.g., to form a p-well, or an n-type conductivity, e.g., to form an n-well.

Memory array 104 can be arranged in rows (each corresponding to a wordline 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

In one embodiment, one or more of NAND strings 206 can be designated as sacrificial strings and used to detect read disturb in memory array 104. For example, NAND string $206_0$ can be designated a sacrificial string. In other embodiments, there can be different NAND strings or additional NAND strings, including two or more NAND strings, which are designated as sacrificial strings. In one embodiment, NAND string $206_0$ can include at least one sacrificial memory cell 208 from each wordline 202. These sacrificial memory cells 208 in the sacrificial memory string $206_0$ are not made available to the memory sub-system controller, and thus are not used to store host data. Rather, the sacrificial memory cells 208 remain in a default state (e.g., an erased state) or are programmed to a known voltage (e.g., a voltage corresponding to a known state). When a read operation is performed on any of the wordlines in memory array 104, a read voltage is applied to the selected wordline and a pass voltage is applied to the unselected wordlines, and the sacrificial memory cells will experience the same read disturb effects as the memory cells storing host data. When the read disturb effects become strong enough, one or more of the sacrificial memory cells can shift from the default or known state to a different state (e.g., to a state associated with a higher voltage level). Thus, local media controller 135 can perform a string sensing operation on the string of sacrificial memory cells to determine whether read disturb has occurred. In one embodiment, to perform the string sensing operation a predefined read voltage is applied to each wordline 202 concurrently, and the current through the sacrificial string $206_0$ is sensed. If any of the sacrificial memory cells 208 in the sacrificial string $206_0$ has shifted to a different state, the sacrificial string $206_0$ will not conduct and current will not flow. Thus, in such a situation, local media controller 135 can determine that read disturb is present in the block of memory array 104.

The memory array 104 in FIG. 2 can be a quasi-two-dimensional memory array and can have a generally planar structure, e.g., where the common source 216, NAND strings 206 and bit lines 204 extend in substantially parallel planes. Alternatively, the memory array 104 in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bit line 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to wordline $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2, it is apparent from the figure that the bit lines 204 of the array of memory cells 104 can be numbered consecutively from bit line $204_0$ to bit line $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3:
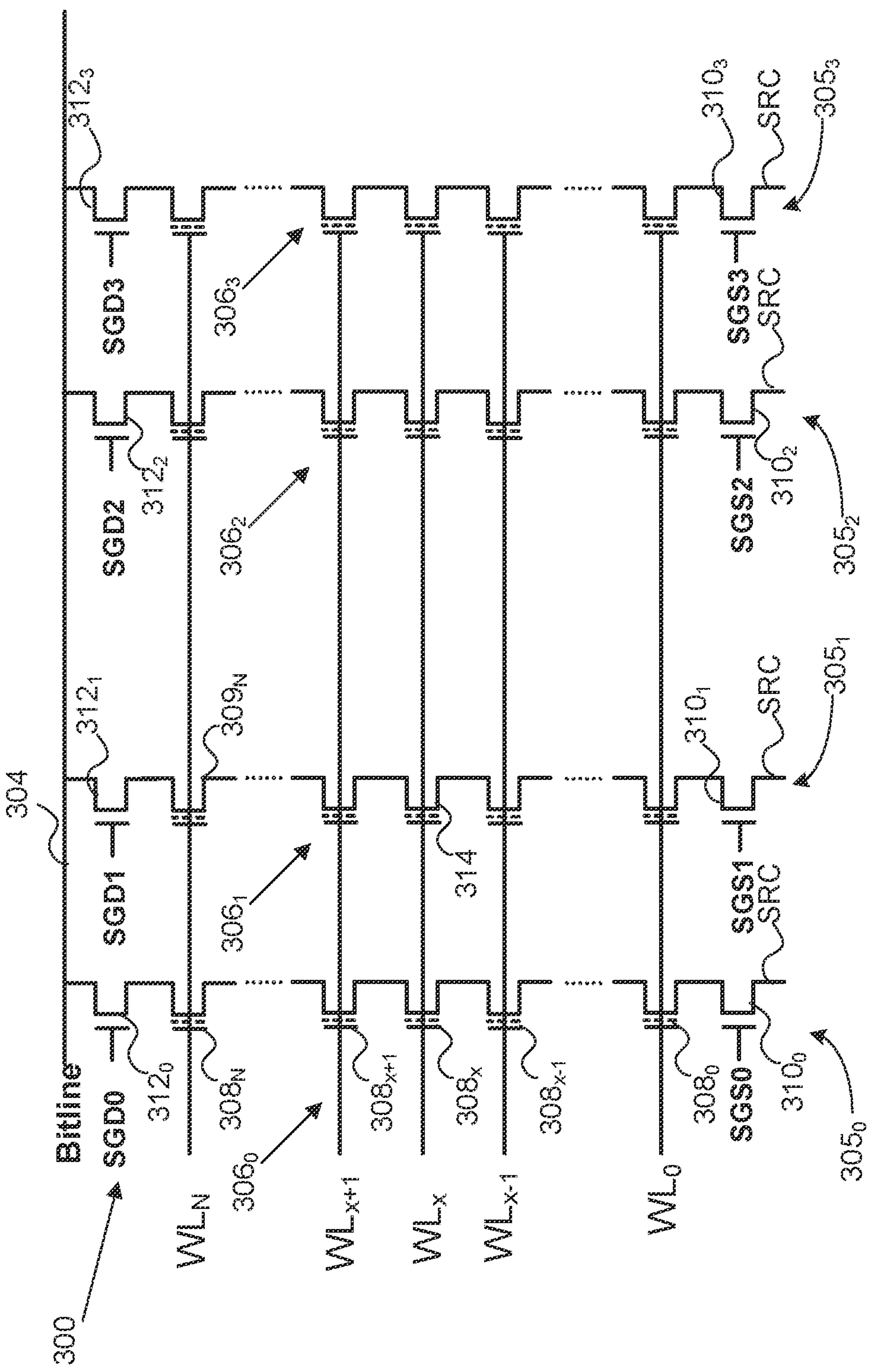
FIG. 3 is a schematic of portions of an array of memory cells implementing multi-level and multi-sub-block programming in accordance with some embodiments of the present disclosure.

FIG. 3 is a schematic of portions of an array of memory cells implementing double single level cell (SLC) programming in accordance with some embodiments of the present disclosure. The portion of the array of memory cells, such as memory array 104, can be a block 300, for example. In one embodiment, the block 300 includes strings of memory cells that can be grouped into sub-blocks, such as sub-blocks $305_0$-$305_3$. Other numbers of sub-blocks can be included in other embodiments.

Specifically, in at least some embodiments, the block 300 includes a bit line 304, where each sub-block is coupled to the bit line 304. The first sub-block $305_0$ can include a first drain select (SGD) transistor $312_0$, a first source select (SGS) transistor $310_0$, and a first string of memory cells $306_0$ coupled therebetween. The second sub-block $305_1$ can include a second SGD transistor $312_1$, a second SGS transistor $310_1$, and a second string of memory cells $306_1$ coupled therebetween. The third sub-block $305_2$ can include a third SGD transistor $312_2$, a third SGS transistor $310_2$, and a third string of memory cells $306_2$ coupled therebetween. The fourth sub-block $305_3$ can include a fourth SGD transistor $312_3$, a fourth SGS transistor $310_3$, and a fourth string of memory cells $306_3$ coupled therebetween. By way of example, the first string of memory cells $306_0$ includes multiple memory cells $308_0$ . . . $308_N$. Each SGS transistor can be connected to a common source (SRC), such as a source voltage line, to provide voltage to the sources of the multiple memory cells $308_0$ . . . $308_N$. In some embodiments, the source voltage line includes a source plate that supplies the source voltage. In at least some embodiments, multiple wordlines (WLs) are coupled with gates of memory cells of each string of memory cells $306_0$ . . . $306_3$.

In these embodiments, a first drain select gate line (SGD0) can be connected to the gate of the first SGD transistor $312_0$, a second drain select gate line (SGD1) can be connected to the gate of the second SGD transistor $312_1$, a third drain select gate line (SGD2) can be connected to the gate of the third SGD transistor $312_2$, and a fourth drain select gate line (SGD3) can be connected to the gate of the fourth SGD transistor $312_3$. Further, a first source select gate line (SGS0) can be connected to the gate of the first SGS transistor $310_0$, a second source select gate line (SGS1) can be connected to the gate of the second SGS transistor $310_1$, a third source select gate line (SGS2) can be connected to the gate of the third SGS transistor $310_2$, and a fourth source select gate line (SGS3) can be connected to the gate of the fourth SGS transistor $310_3$.

In one embodiment, local media controller 135 can perform a multi-level and multi-sub-block program operation to concurrently program different logic states (e.g., levels) to memory cells in two or more separate sub-blocks of block 300 using a single programming pulse applied to a selected wordline (e.g., $WL_N$). Further details regarding the multi-level and multi-sub-block program operation are described with reference to FIG. 4.

Figure 4:
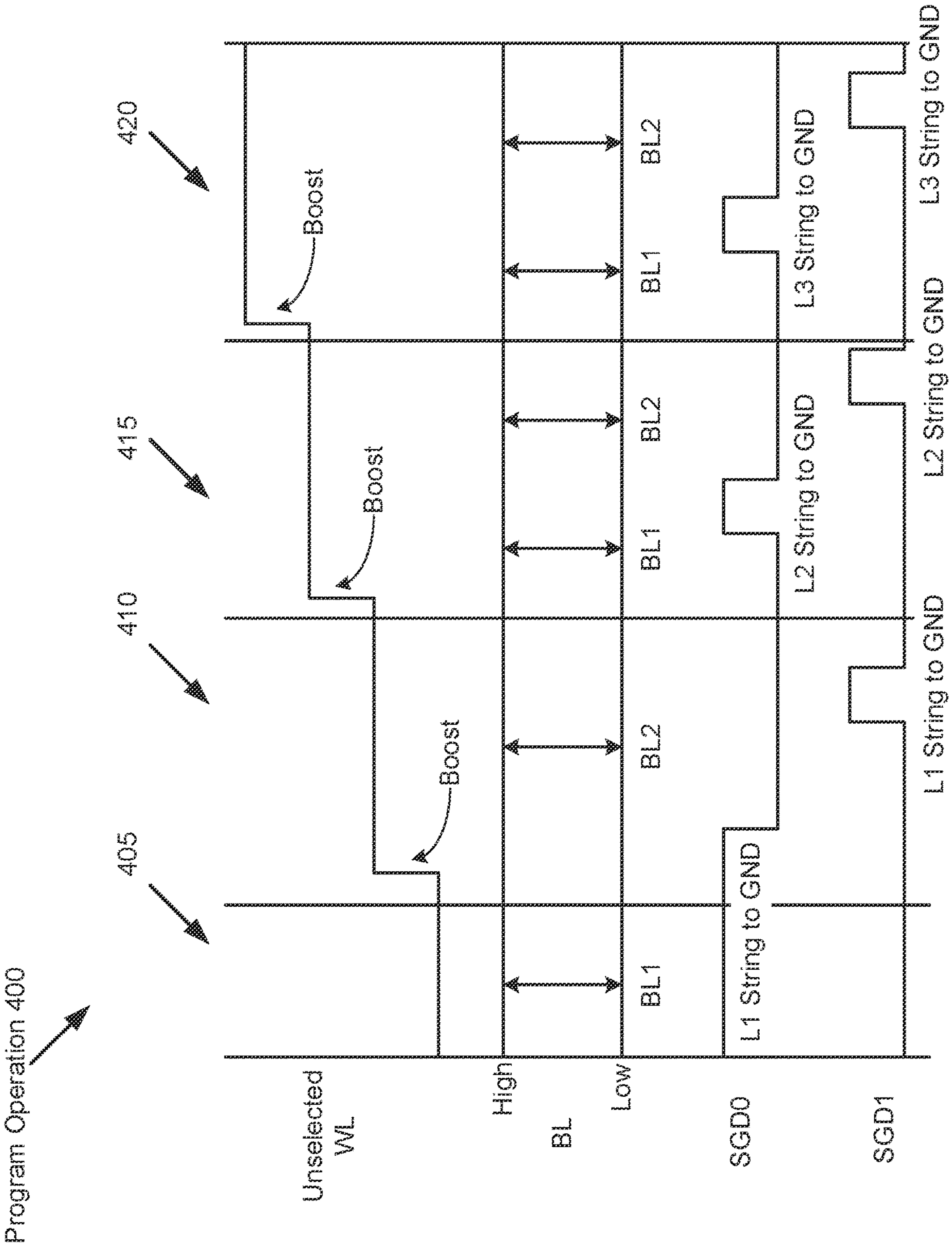
FIG. 4 is a timing diagram for multi-level and multi-sub-block programming in a memory device, in accordance with embodiments of the present disclosure.

FIG. 4 is a timing diagram 400 illustrating a multi-level and multi-sub-block program operation, in accordance with some embodiments of the present disclosure. During the program phase, a program voltage or pulse is applied to selected word lines (e.g., $WL_N$ as described with reference to FIG. 3) of the memory device 130, in order to program a certain level of charge to the selected memory cells on the word lines representative of a desired value. Timing diagram 400 illustrates the program operation on two bit lines (e.g., two of bit lines 204 or bit lines 304) and two sub-blocks (e.g., two of sub-blocks 305). For example, the timing diagram can illustrate a programming operation on bit lines $204_0$ and $204_2$ and sub-blocks $305_0$ and $305_1$. That is, each sub-block 305 illustrated in block 300 can include additional bit lines that are not shown. In such embodiments, the sub-block 305 can include additional strings of memory cells 306—e.g., another string of memory cells 306 coupled to a different bit line not shown. Accordingly, the first and second bit lines illustrated in timing diagram 400 can refer to either bit line 304 or the bit line coupled to a different string of memory cells 306 in the sub-block 305. The operations described herein can apply to either bit line. It should be noted the method described herein can be applied to more than two bit lines or more than two sub-blocks concurrently. In such examples, additional latches can be implemented in each page buffer. It should be noted, each time interval is an example and is not limiting on the claims. That is, each time interval can be longer or shorter than illustrated in FIG. 4 in some embodiments.

Local media controller 135 can select bit lines (e.g., can cause bit lines to go high) and turn off or on respective SGDs based on a data pattern of bits (e.g., logic states or levels) to be programmed to respective memory cells 308 during the program operation. In one embodiment, memory cells 308 can be multi-level (MLC) cells—e.g., each memory cell 308 can store two or more bits. In such embodiments, the local media controller 135 can select bit lines 304 and turn on or off respective SGDs during the program operation to condition different strings of memory cells 306 to a channel potential associated with the respective data pattern. The local media controller 135 can then cause a program voltage to be applied after the time interval 420 to concurrently program the different memory cells.

For example, in one embodiment, the data pattern of bits can indicate to program a memory cell 308 in string of memory cells $306_0$ to a first logic state—e.g. a level zero (0) state or bits having value '00.' In such examples, during time interval 405 the local media controller 135 can cause a voltage to be applied to bit line 304 (e.g., cause bit line 304 to go high) or cause $SGD_0$ to turn off. In some embodiments, this can cause the string of memory cells $306_0$ (e.g., the pillar of memory cells $306_0$) to be floating or disconnected from ground. During time interval 410, the local media controller 135 can cause a boost voltage to be applied to unselected word lines (e.g., $WL_0$ through $WL_{x+1}$ or word lines not associated with the program operation) for a first time. Because the bit line 304 is high or $SGD_0$ is off, the boost voltage can boost the voltage at the string of memory cells $\mathbf{306}_0$ by an amount (e.g., by a boost amount). The local media controller 135 can cause the voltage to continue being applied to the bit line 304 or cause the $SGD_0$ to remain off after applying the boost voltage during the time interval 410. During time interval 415, the local media controller 135 can cause a boost voltage to be applied to unselected word lines for a second time. Because the bit line 304 remains high or the $SGD_0$ remains off, the boost voltage can boost the voltage at the string of memory cells $\mathbf{306}_0$ by the amount again. Accordingly, after the local media controller 135 causes the boost voltage to be applied the second time, the channel potential at the string of memory cells $\mathbf{306}_0$ can be two boost amounts (e.g., two times boost). The local media controller 135 can cause the voltage to continue being applied to the bit line 304 or cause the $SGD_0$ to remain off after applying the boost voltage during the time interval 415. During time interval 420, the local media controller 135 can cause a boost voltage to be applied to unselected word lines for a third time. Because the bit line 304 remains high or $SGD_0$ remains off, the boost voltage can boost the voltage at the string of memory cells $\mathbf{306}_0$ by the amount again. Accordingly, after the local media controller 135 causes the boost voltage to be applied the third time, the channel potential at the string of memory cells $\mathbf{306}_0$ can be three boost amounts (e.g., three times boost). After conditioning the string of memory cells $\mathbf{306}_0$, the local media controller 135 can apply a program pulse to the selected word line ($WL_n$). In some embodiments, the logic state or bits programmed to the memory cell 308 can depend on a difference between a strength of the program pulse and the channel potential of the string of memory cells $\mathbf{306}_0$. In this embodiment, because the string of memory cells $\mathbf{306}_0$ has a channel potential of three boost amounts, the program pulse can cause a value '00' to be programmed to the selected memory cell 308. In some embodiments, the local media controller 135 can cause the memory cell 308 in the string of memory cells $\mathbf{306}_0$ to be programmed concurrent with a memory cell of sub-block $\mathbf{305}_1$ as described below—e.g., multiple sub-blocks can be programmed concurrently. In some embodiments, the local media controller 135 can cause the memory cell 308 in the string of memory cells $\mathbf{306}_0$ to be programmed concurrent with another memory cell in a different string of memory cells in the sub-block $\mathbf{305}_0$—e.g., on a different bit line in the sub-block $\mathbf{305}_0$. In some embodiments, the other memory cells programmed concurrently can be programmed to the same or different level—e.g., to level 1, 2, or 3 as described below.

In one embodiment, the data pattern of bits can indicate to program a memory cell 308 of string of memory cells $\mathbf{306}_0$ and/or string of memory cells $\mathbf{306}_1$ to a second logic state—e.g. a level one (1) state or bits having value '01.' For example, if programming a memory cell 308 of string of memory cells $\mathbf{306}_0$, during time interval 405 the local media controller 135 can cause a voltage to not be applied to bit line 304 (e.g., cause bit line 304 to go low) and cause $SGD_0$ to turn on. In some embodiments, this can cause the string of memory cells $\mathbf{306}_0$ (e.g., the pillar of memory cells $\mathbf{306}_0$) to be connected to ground. During time interval 410, the local media controller 135 can cause a boost voltage to be applied to unselected word lines (e.g., $WL_0$ through $WL_{x+1}$ or word lines not associated with the program operation) for a first time. Because the bit line 304 is low and $SGD_0$ is on, the boost voltage applied can be discharged to ground. Accordingly, after time interval 410, the channel potential of string of memory cells $\mathbf{306}_0$ can be at ground. If programming a memory cell 308 of string of memory cells $\mathbf{306}_1$ or a memory cell coupled with a different bit line (in the same or different sub-block), the local media controller 135 can cause a voltage to be applied to the respective bit line or turn off the respective SGD gate to float the respective string of memory cells 306 during time interval 405. The local media controller can then cause the boost voltage to be applied to boost the channel potential to by the amount—e.g., to the first boost amount. The local media controller 135 can then selectively discharge the respective string of memory cells 306 during interval 410. For example, local media controller 135 can cause a voltage to not be applied to the respective bit line (e.g., bit line 2 can go low) and turn on the SGD (e.g., turn on SGD1). In such examples, the respective string of memory cells 306 can be discharged to ground. Accordingly, in either case, after interval 410 the memory cell 308 in a string of memory cells 306 to be programmed to the second logic state can be at a ground channel potential.

After selectively discharging memory cells 308 in strings of memory cells 306 to be programmed to ground, the local media controller 135 can cause a voltage to continue being applied to the bit line 304 or cause the $SGD_0$ to remain off. During time interval 415, the local media controller 135 can cause a boost voltage to be applied to unselected word lines for a second time. Because the bit line 304 remains high or $SGD_0$ remains off, the boost voltage can boost the voltage at the string of memory cells $\mathbf{306}_0$ by the amount again. Accordingly, after the local media controller 135 causes the boost voltage to be applied the second time, the channel potential at the string of memory cells $\mathbf{306}_0$ can be one boost amounts (e.g., one times boost) since the string of memory cells $\mathbf{306}_0$ can be discharged to ground during interval 410. The local media controller 135 can cause the voltage to continue being applied to the bit line 304 or cause the $SGD_0$ to remain off after applying the boost voltage during the time interval 415. During time interval 420, the local media controller 135 can cause a boost voltage to be applied to unselected word lines for a third time. Because the bit line 304 remains high or $SGD_0$ remains off, the boost voltage can boost the voltage at the string of memory cells $\mathbf{306}_0$ by the amount again. Accordingly, after the local media controller 135 causes the boost voltage to be applied the third time, the channel potential at the string of memory cells $\mathbf{306}_0$ can be two boost amounts (e.g., two times boost). If programming a memory cell 308 of string of memory cells $\mathbf{306}_1$ or a memory cell coupled with a different bit line (in the same or different sub-block), the local media controller 135 can cause the respective bit line to remain high or keep the SGD on during time after the discharge such that the respective channel potential can be at two times boost. After conditioning the string of memory cells $\mathbf{306}_0$ (e.g., discharging memory cells 308 to cause a two times boost channel potential when programming the '01' value), the local media controller 135 can apply a program pulse to the selected word line ($WL_n$). In this embodiment, because the string of memory cells $\mathbf{306}_0$ has a channel potential of two boost amounts, the program pulse can cause a value '01' to be programmed to the selected memory cell 308. In some embodiments, the local media controller 135 can cause the memory cell 308 in the string of memory cells $\mathbf{306}_0$ to be programmed concurrent with sub-block $\mathbf{305}_1$ as described below—e.g., multiple sub-blocks can be programmed concurrently. In some embodiments, the local media controller 135 can cause the memory cell 308 in the string of memory cells $\mathbf{306}_0$ to be programmed concurrent with another memory cell in sub-block $\mathbf{305}_0$—e.g., on a different bit line in the sub-block $305_0$. In some embodiments, the other memory cells programmed concurrently can be programmed to the same or different level—e.g., to level 0, 1, 2, or 3 as described herein.

In one embodiment, the data pattern of bits can indicate to program a memory cell 308 of string of memory cells $\mathbf{306}_0$ and/or string of memory cells $\mathbf{306}_1$ to a third logic state—e.g. a level two (2) state or bits having value '10.' For example, if programming a memory cell 308 of string of memory cells $\mathbf{306}_0$, during time interval 405 the local media controller 135 can either cause a voltage to be applied to bit line 304 (e.g., cause bit line 304 to go high) or cause $SGD_0$ to turn off. In some embodiments, this can cause the string of memory cells $\mathbf{306}_0$ (e.g., the pillar of memory cells $\mathbf{306}_0$) to float or be disconnected from ground. During time interval 410, the local media controller 135 can cause a boost voltage to be applied to unselected word lines (e.g., $WL_0$ through $WL_{x+1}$ or word lines not associated with the program operation) for a first time. Because the bit line 304 is high or the $SGD_0$ is off, the boost voltage applied can boost the channel potential by the amount. Accordingly, after time interval 410, the channel potential of string of memory cells $\mathbf{306}_0$ can be at the first boost amount. The local media controller 135 can perform a similar process if programming a memory cell 308 of string of memory cells $\mathbf{306}_1$ or a memory cell coupled with a different bit line (in the same or different sub-block), the local media controller 135 to the third logic state. During time interval 415, the local media controller 135 can cause a boost voltage to be applied to unselected word lines for a second time. Because the bit line 304 remains high or the $SGD_0$ remains off, the boost voltage can boost the voltage at the string of memory cells $\mathbf{306}_0$ by the amount again. Accordingly, after the local media controller 135 causes the boost voltage to be applied the second time, the channel potential at the string of memory cells $\mathbf{306}_0$ can be two boost amounts (e.g., two times boost). After applying the boost voltage the second time, the local media controller can cause the voltage to not be applied to the bit line 304 (e.g., cause the bit line 304 to go low) and turn on the $SGD_0$ and discharge the string of memory cells $\mathbf{306}_0$ to ground. If programming a memory cell 308 of string of memory cells $\mathbf{306}_1$ or a memory cell coupled with a different bit line (in the same or different sub-block), the local media controller 135 can cause a voltage to be not be applied to the respective bit line and turn on the respective SGD (e.g., $SGD_1$) and discharge the respective string of memory cells 306 to ground during the time interval 415. That is, the local media controller 135 can cause multiple sub-blocks 305 to be discharged during a given time interval (e.g., following a boost voltage being applied). In some embodiments, the local media controller 135 can discharge one string of memory cells 306 at a time. Accordingly, programming additional sub-blocks 305 to the third logic state can include a longer time interval 415—e.g., an additional time associated with discharging the additional string of memory cells 306. In either case, after interval 415 the memory cell 308 in a string of memory cells 306 to be programmed to the third logic state can be at a ground channel potential.

After selectively discharging memory cells 308 in strings of memory cells 306 to be programmed to ground during time interval 415, the local media controller 135 can cause a voltage to be applied to the bit line 304 or cause the $SGD_0$ to turn off. During time interval 420, the local media controller 135 can cause a boost voltage to be applied to unselected word lines for a third time. Because the bit line 304 remains high or $SGD_0$ remains off, the boost voltage can boost the voltage at the string of memory cells $\mathbf{306}_0$ by the amount again. Accordingly, after the local media controller 135 causes the boost voltage to be applied the third time, the channel potential at the string of memory cells $\mathbf{306}_0$ can be one boost amounts (e.g., one times boost) since the string of memory cells $\mathbf{306}_0$ can be discharged to ground during interval 415. If programming a memory cell 308 of string of memory cells $\mathbf{306}_1$ or a memory cell coupled with a different bit line (in the same or different sub-block), the local media controller 135 can cause the respective bit line to remain high or keep the SGD on during time after the discharge such that the respective channel potential can be at one times boost after timing interval 420. After conditioning the string of memory cells $\mathbf{306}_0$ (e.g., discharging memory cells 308 to cause a one times boost channel potential when programming the '10 value), the local media controller 135 can apply a program pulse to the selected word line ($WL_n$). In this embodiment, because the string of memory cells $\mathbf{306}_0$ has a channel potential of one boost amount, the program pulse can cause a value '01' to be programmed to the selected memory cell 308. In some embodiments, the local media controller 135 can cause the memory cell 308 in the string of memory cells $\mathbf{306}_0$ to be programmed concurrent with sub-block $\mathbf{305}_1$ as described below—e.g., multiple sub-blocks can be programmed concurrently. In some embodiments, the local media controller 135 can cause the memory cell 308 in the string of memory cells $\mathbf{306}_0$ to be programmed concurrent with another memory cell in sub-block $\mathbf{305}_0$—e.g., on a different bit line in the sub-block $\mathbf{305}_0$. In some embodiments, the other memory cells programmed concurrently can be programmed to the same or different level—e.g., to level 0, 1, 2, or 3 as described herein.

In one embodiment, the data pattern of bits can indicate to program a memory cell 308 of string of memory cells $\mathbf{306}_0$ and/or string of memory cells $\mathbf{306}_1$ to a fourth logic state—e.g. a level three (3) state or bits having value '11.' For example, if programming a memory cell 308 of string of memory cells $\mathbf{306}_0$, during time interval 405 the local media controller 135 can either cause a voltage to be applied to bit line 304 (e.g., cause bit line 304 to go high) or cause $SGD_0$ to turn off. In some embodiments, this can cause the string of memory cells $\mathbf{306}_0$ (e.g., the pillar of memory cells $\mathbf{306}_0$) to float or be disconnected from ground. During time interval 410, the local media controller 135 can cause a boost voltage to be applied to unselected word lines (e.g., $WL_0$ through $WL_{x+1}$ or word lines not associated with the program operation) for a first time. Because the bit line 304 is high or the $SGD_0$ is off, the boost voltage applied can boost the channel potential by the amount. Accordingly, after time interval 410, the channel potential of string of memory cells $\mathbf{306}_0$ can be at the first boost amount. The local media controller 135 can perform a similar process if programming a memory cell 308 of string of memory cells $\mathbf{306}_1$ or a memory cell coupled with a different bit line (in the same or different sub-block), the local media controller 135 to the third logic state. During time interval 415, the local media controller 135 can cause a boost voltage to be applied to unselected word lines for a second time. Because the bit line 304 remains high or the $SGD_0$ remains off, the boost voltage can boost the voltage at the string of memory cells $\mathbf{306}_0$ by the amount again. Accordingly, after the local media controller 135 causes the boost voltage to be applied the second time, the channel potential at the string of memory cells $\mathbf{306}_0$ can be two boost amounts (e.g., two times boost). During time interval 420, the local media controller 135 can cause a boost voltage to be applied to unselected word lines for a third time. Because the bit line 304 remains high or the $SGD_0$ remains off, the boost voltage can boost the voltage at the string of memory cells $306_0$ by the amount again. Accordingly, after the local media controller 135 causes the boost voltage to be applied the third time, the channel potential at the string of memory cells $306_0$ can be three boost amounts (e.g., three times boost). After applying the boost voltage the third time, the local media controller 135 can cause the voltage to not be applied to the bit line 304 (e.g., cause the bit line 304 to go low) and turn on the $SGD_0$ and discharge the string of memory cells $306_0$ to ground. If programming a memory cell 308 of string of memory cells $306_1$ or a memory cell coupled with a different bit line (in the same or different sub-block), the local media controller 135 can cause a voltage to be not be applied to the respective bit line and turn on the respective SGD (e.g., $SGD_1$) and discharge the respective string of memory cells 306 to ground during the time interval 420. That is, the local media controller 135 can cause multiple sub-blocks 305 to be discharged during a given time interval (e.g., following a boost voltage being applied). In either case, after interval 420, the memory cell 308 in a string of memory cells 306 to be programmed to the third logic state can be at a ground channel potential.

After selectively discharging memory cells 308 in strings of memory cells 306 to be programmed to ground, the local media controller 135 can cause a program voltage to be applied to the selected word line ($WL_n$). That is, after conditioning the string of memory cells $306_0$ (e.g., discharging memory cells 308 to cause a ground channel potential when programming the '11' value), the local media controller 135 can apply a program pulse to the selected word line ($WL_n$). In this embodiment, because the string of memory cells $306_0$ has a channel potential at ground, the program pulse can cause a value '11' to be programmed to the selected memory cell 308. In some embodiments, the local media controller 135 can cause the memory cell 308 in the string of memory cells $306_0$ to be programmed concurrent with sub-block $305_1$ as described below—e.g., multiple sub-blocks can be programmed concurrently. In some embodiments, the local media controller 135 can cause the memory cell 308 in the string of memory cells $306_0$ to be programmed concurrent with another memory cell in sub-block $305_0$—e.g., on a different bit line in the sub-block $305_0$. In some embodiments, the other memory cells programmed concurrently can be programmed to the same or different level—e.g., to level 0, 1, 2, or 3 as described herein.

Although timing diagram 400 illustrates examples where both the first bit line and second bit line go high during each timing interval (e.g., a sub-block 305 is discharged), other examples are possible. That is, the local media controller 135 can cause strings of memory cells 306 to be selectively discharged according to the data pattern to be programmed. For example, the local media controller can cause a first sub-block $305_0$ to never discharge (e.g., to be at a three times boost amount), a second sub-block $305_1$ to discharge after applying the first boost voltage, a third sub-block $305_2$ to discharge after applying the second boost voltage, and a fourth sub-block $305_3$ to discharge after applying the third boost voltage, or any combination thereof. That is, the local media controller 135 can condition multiple sub-blocks to different channel potentials according to the multiple levels to be programmed to the memory cells 308.

Although timing diagram 400 illustrates programming memory cells in two different sub-blocks (on the same or different bit lines), the method described herein can be utilized for memory cells storing three or more bits. In such examples, the local media controller can cause the boost voltage to be applied one less time than the number of levels—e.g., seven times for eight levels (e.g., triple level cell), 15 times for sixteen levels (e.g., quadruple level cells), and so forth. In such examples, the page buffers can include additional latches to store the additional bits programmed to a respective memory cell 308. Additionally, the local media controller can selectively discharge a given sub-block 305 after each time the boost voltage is applied—e.g., can concurrently condition multiple strings of memory cells 306 to a respective channel potential based on the data pattern to be programmed before applying the programming pulse. By implementing a single programming pulse after conditioning multiple memory cells 306 to different channel potentials across multiple sub-blocks, the local media controller 135 can cause multiple levels to be programmed concurrently at multiple sub-blocks—e.g., multiple memory cells storing different logical states across multiple sub-blocks can be programmed concurrently.

Figure 5:
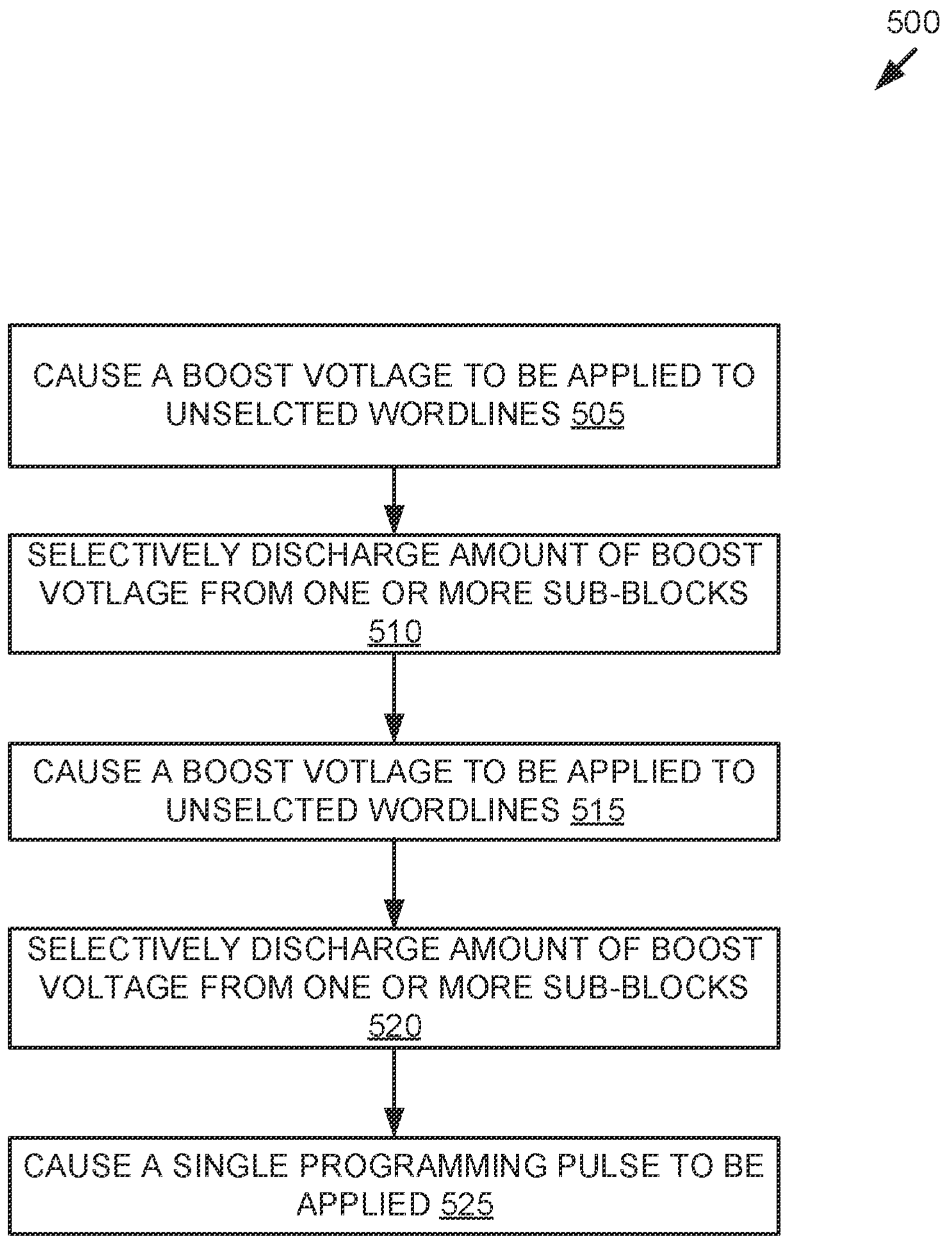
FIG. 5 is a flow diagram of an example method of multi-level and multi-sub-block programming in a memory device, in accordance with some embodiments of the present disclosure.

FIG. 5 is a flow diagram of an example method for a multi-level and multi-sub-block program operation in a memory device, in accordance with the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by local media controller 135 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, a boost voltage is applied. For example, the processing logic (e.g., local media controller 135) can cause a boost voltage to be applied to unselected wordlines—e.g., wordlines not associated with the program operation. In some embodiments, the processing logic can cause a boost voltage to be applied to one or more times—e.g., as described with reference to FIG. 4. For example, the processing logic can cause the boost voltage to be applied three or more times—e.g., for a multi-level memory cell the processing logic can apply the boost voltage 3 times. In some embodiments, the processing logic can cause the boost voltage to be applied to a plurality of unselected wordlines of a block of the memory array (e.g., memory array 105). In some embodiments, the block can include a plurality of sub-blocks, where each sub-block includes one or more strings or memory cells sharing a pillar of channel material. In some embodiments, the processing logic can cause the boost voltage to be applied to boost a channel potential of each of the plurality of sub-blocks by an amount each time the boost voltage is applied. For example, after applying the boost voltage the first time, the channel potential can be one boost amount, after applying the boost voltage the second time, the channel potential can be two boost amount, and so forth. In one embodiment, the sub-blocks can include respective select gate devices to couple the string of memory cells to a bit line. In one embodiment, each memory cell of the string of memory cells is associated with a respective wordline of the plurality of wordlines. In one embodiment, each memory cell can store two or more bits.

At operation 510, an amount of boost can be selectively discharged. For example, the processing logic can cause the amount of boost from one or more of the plurality of sub-blocks to be discharged. In some embodiments, the boost can be selectively discharged from the one or more sub-blocks according to a data pattern representing a sequence of bits to be programmed to respective memory cells of the plurality of sub-blocks. In one embodiment, the processing logic can cause a first sub-block of the plurality of sub-blocks to discharge a first amount (e.g., by a first boost amount) after applying the boost voltage for the first time. In one embodiment, each sub-block can include one or more bits lines. In such embodiments, the processing logic can discharge a first portion of a sub-block coupled to a first bit line by the first amount after the first time. In at least one embodiment, the processing logic can cause a respective select gate device to turn on (e.g., activate) to ground the one or more sub-blocks—e.g., the discharge can occur by turning on the select gate device and letting the memory string go to a ground potential. In one embodiment, the processing logic can cause a first select gate device of the first sub-block to activate after causing the boost voltage to be applied the first time.

At operation 515, the boost voltage is applied again. For example, the processing logic can cause the boost voltage to be applied a second time after selectively discharging one or more sub-blocks. In some embodiments, applying the boost voltage the second time can cause different channel potentials at different memory strings. For example, some memory strings can be selectively discharged after the boost voltage is applied the first time. Accordingly, some memory strings can have a channel potential of one boost amount, while other strings of memory cells can have a channel potential of two boost amounts.

At operation 520, an amount of boost can be selectively discharged. For example, the processing logic can cause the amount of boost from one or more of the plurality of sub-blocks to be discharged. In some embodiments, the boost can be selectively discharged from the one or more sub-blocks according to a data pattern representing a sequence of bits to be programmed to respective memory cells of the plurality of sub-blocks. In one embodiment, the processing logic can cause a second sub-block to discharge by a second amount after causing the boost voltage to be applied the second time. In at least one embodiment, the processing logic can cause a second select gate device of the second sub-block to activate to ground the second sub-block—e.g., cause a string of memory cells to discharge to ground by activating the second select gate device. In one embodiment, the processing logic can cause a second portion of the sub-block coupled to the second bit line to discharge by the second amount after applying the boost voltage the second time. In some embodiments, the first portion can be associated with a first logic state and the second portion can be associated with a second logic state to be programmed. In one embodiment, the processing logic can continue performing operations 515-520 according to the data pattern. In some embodiments, the number of times the boost voltage is applied corresponds to a number of bits stored by each memory cell. For example, the processing logic can apply the boost voltage three times if the memory cells store two bits (e.g., four levels), seven times if the memory cells store three bits (e.g., eight levels), 15 times if the memory cells store four bits (e.g., 16 levels), and so forth. In some embodiments, the processing logic can also selectively discharge one or more sub-blocks between applying the boost voltages according to the data pattern. For example, the processing logic can cause a third sub-block to discharge by a third amount after applying the boost voltage the third time—e.g., activate a third select gate device of the third sub-block after applying the boost voltage a third time. In some embodiments, the processing logic can cause one or more sub-blocks to not be discharged. For example, the processing logic can refrain from causing a fourth sub-block from being discharged after applying the boost voltage one or more times—e.g., refrain from discharging the fourth sub-block entirely. Accordingly, the processing logic can refrain from causing the select gate of the fourth sub-block to be activated—e.g., can cause the select gate device of the fourth sub-block to remain deactivated.

At operation 525, a single programming pulse is applied. For example, the processing logic can cause a single programming pulse to be applied to one or more selected wordlines of the block to program the respective memory cells of the plurality of sub-blocks according to the data pattern. In some embodiments, after applying the boost voltages, the channel potential at each sub-block (or at each memory string of the sub-blocks) can be conditioned according to the data pattern. Accordingly, a single programming pulse can concurrently program multiple levels or logic states to memory cells in different sub-blocks. For example, after the conditioning, the first sub-block can have a channel potential of two boost amounts (because it was discharged after the first time), the second sub-block can have a channel potential of one boost amount (because it was discharged after the second time), the third sub-block can have a channel potential of zero (e.g., ground) because it was discharged after the third time, and the fourth sub-block can have a channel potential of three boost amounts because it was not discharged. When the processing logic causes the programming pulse to be applied, the first sub-block can be programmed to a first logic state, the second sub-block can be programmed to a second logic state, the third sub-block can be programmed to a third logic state, and the fourth sub-block can be programmed to a fourth logic state as described with reference to FIG. 4.

Figure 6:
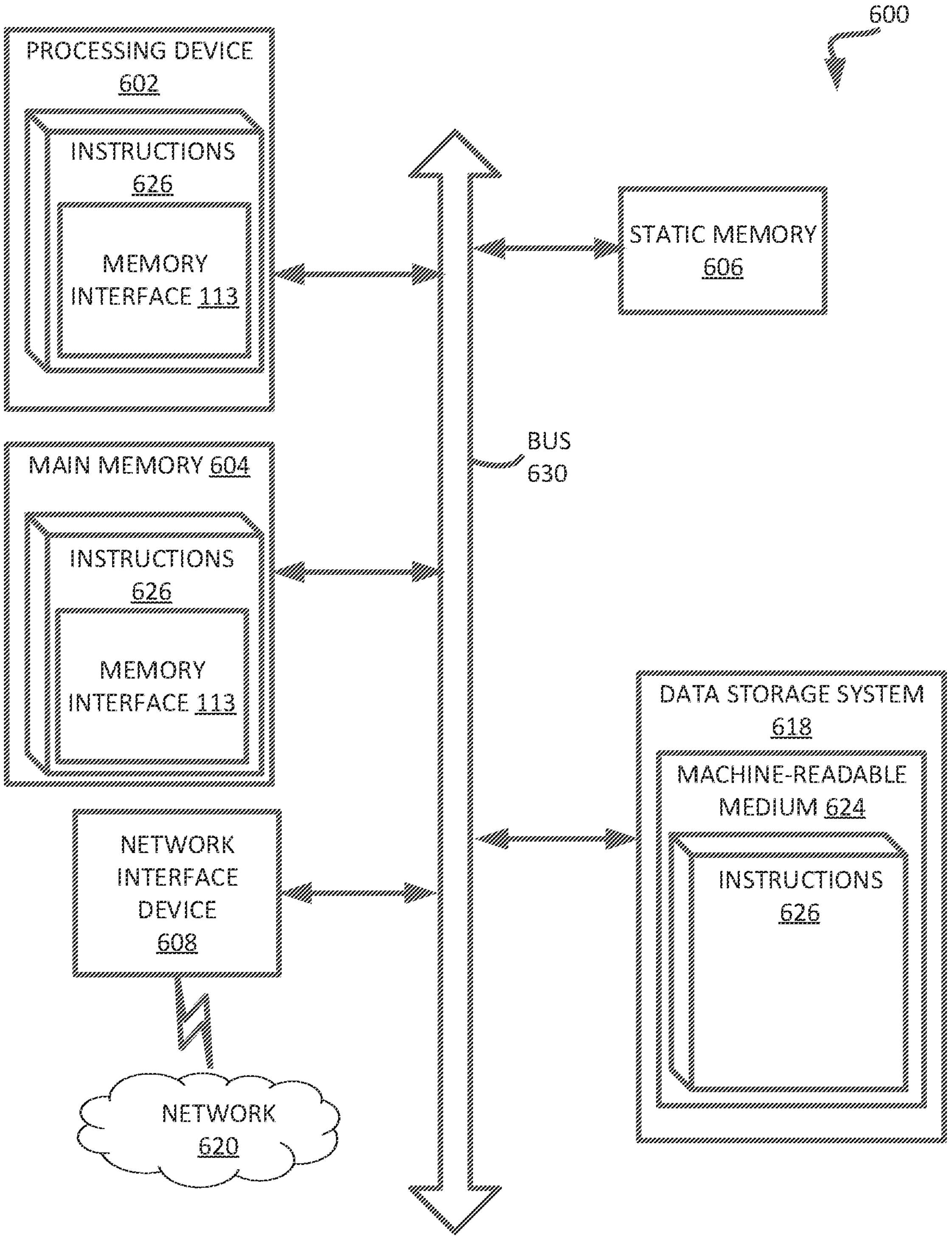
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the program management component 113 of FIG. 1 to perform a program recovery phase). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term “machine” shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 404 can correspond to the memory sub-system 110 of FIG. 1.

In one embodiment, the instructions 626 include instructions to implement functionality corresponding to a program management component 113 to perform a program operation for the processing device 602. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:

a memory array; and control logic, operatively coupled with the memory array, to perform operations comprising:

causing a boost voltage to be applied three or more times to a plurality of unselected wordlines of a block of the memory array, the block comprising a plurality of sub-blocks, and the boost voltage to boost a channel potential of each of the plurality of sub-blocks by an amount each time the boost voltage is applied;

selectively discharging the amount of boost voltage from one or more of the plurality of sub-blocks after each time of the three or more times the boost voltage is applied to condition different sub-blocks of the plurality of sub-blocks to different channel potentials according to a data pattern representing a sequence of bits to be programmed to respective memory cells of the plurality of sub-blocks; and causing a single programming pulse to be applied to one or more selected wordlines of the block to program the respective memory cells of the plurality of sub-blocks to different logic states based on the different channel potentials, wherein a first sub-block discharged after a first time the boost voltage is applied is programmed to a first logic state and a second sub-block discharged after a second time the boost voltage is applied is programmed to a second logic state different from the first logic state.

2. The memory device of claim 1, wherein the control logic is to perform further operations comprising:

discharging a first sub-block by a first amount after applying the boost voltage for a first time; and discharging a second sub-block by a second amount after applying the boost voltage a second time.

3. The memory device of claim 2, wherein the control logic is to perform further operations comprising:

discharging a third sub-block by a third amount after applying the boost voltage for a third time; and refraining from discharging a fourth sub-block after applying the boost voltage three or more times.

4. The memory device of claim 3, wherein the respective memory cell of the first sub-block is programmed to a first logic state, the respective memory cell of the second sub-block is programmed to a second logic state, the respective memory cell of the third sub-block is programmed to a third logic state, and the respective memory cell of the fourth sub-block is programmed to fourth logic state after the programming pulse is applied.

5. The memory device of claim 1, wherein a number of times the boost voltage is applied corresponds to a number of bits stored by the memory cells.

6. The memory device of claim 1, wherein each sub-block comprises one or more bitlines, and wherein the control logic is to perform further operations comprising:

discharging a first portion of a sub-block coupled to a first bitline of the one or more bitlines by a first amount after applying the boost voltage for a first time; and discharging a second portion of the sub-block coupled to a second bitline of the one or more bitlines by a second amount after applying the boost voltage for a second time, wherein the first portion is associated with a first logic state and the second portion is associated with a second logic state.

7. The memory device of claim 1, wherein the respective memory cells of the plurality of sub-blocks each store two or more bits.

8. A method, comprising:

causing a boost voltage to be applied three or more times to a plurality of unselected wordlines of a block of a memory array, the block comprising a plurality of sub-blocks, and the boost voltage to boost a channel potential of each of the plurality of sub-blocks by an amount each time the boost voltage is applied;

selectively discharging the amount of boost voltage from one or more of the plurality of sub-blocks after each time of the three or more times the boost voltage is applied to condition different sub-blocks of the plurality of sub-blocks to different channel potentials according to a data pattern representing a sequence of bits to be programmed to respective memory cells of the plurality of sub-blocks; and causing a single programming pulse to be applied to one or more selected wordlines of the block to program the respective memory cells of the plurality of sub-blocks to different logic states based on the different channel potentials, wherein a first sub-block discharged after a first time the boost voltage is applied is programmed to a first logic state and a second sub-block discharged after a second time the boost voltage is applied is programmed to a second logic state different from the first logic state.

9. The method of claim 8, further comprising:

discharging a first sub-block by a first amount after applying the boost voltage for a first time; and discharging a second sub-block by a second amount after applying the boost voltage a second time.

10. The method of claim 9, further comprising:

discharging a third sub-block by a third amount after applying the boost voltage for a third time; and refrain from discharging a fourth sub-block after applying the boost voltage three or more times.

11. The method of claim 10, wherein the respective memory cell of the first sub-block is programmed to a first logic state, the respective memory cell of the second sub-block is programmed to a second logic state, the respective memory cell of the third sub-block is programmed to a third logic state, and the respective memory cell of the fourth sub-block is programmed to fourth logic state after the programming pulse is applied.

12. The method of claim 8, wherein a number of times the boost voltage is applied corresponds to a number of bits stored by the memory cells.

13. The method of claim 8, wherein each sub-block comprises one or more bitlines, the method further comprising:

discharging a first portion of a sub-block coupled to a first bitline of the one or more bitlines by a first amount after applying the boost voltage for a first time; and discharging a second portion of the sub-block coupled to a second bitline of the one or more bitlines by a second amount after applying the boost voltage for a second time, wherein the first portion is associated with a first logic state and the second portion is associated with a second logic state.

14. The method of claim 8, wherein the respective memory cells of the plurality of sub-blocks each store two or more bits.

* * * * *